United States Patent

Zhao et al.

[11] Patent Number: 5,859,181
[45] Date of Patent: Jan. 12, 1999

[54] SILOXANE POLYMIDE AND HEAT-RESISTANT ADHESIVE CONTAINING THE SAME

[75] Inventors: Dong Zhao; Hiroshi Sakuyama, both of Kitaibaraki; Tomoko Katono, Iwaki; Lin-chiu Chiang; Jeng-Tain Lin, both of Kitaibaraki, all of Japan

[73] Assignee: Nippon Mektron, Limited, Tokyo, Japan

[21] Appl. No.: 992,774

[22] Filed: Dec. 17, 1997

[30] Foreign Application Priority Data

Dec. 20, 1996 [JP] Japan ................................. 8-354825
Sep. 19, 1997 [JP] Japan ................................. 9-273497

[51] Int. Cl.⁶ .......................... C08G 73/10; C08G 69/26
[52] U.S. Cl. .......................... 528/353; 528/26; 528/28; 528/33; 528/38; 528/41; 528/125; 528/128; 528/170; 528/172; 528/173; 528/179; 528/183; 528/185; 528/188; 528/220; 528/229; 528/350; 525/431; 428/457; 428/458; 428/473.5
[58] Field of Search .......................... 528/38, 41, 26, 528/28, 33, 125, 128, 170, 172, 173, 179, 183, 185, 188, 220, 229, 350, 353; 525/431; 428/458, 457, 473.5

[56] References Cited

U.S. PATENT DOCUMENTS

| | | | |
|---|---|---|---|
| 4,373,088 | 2/1983 | Disteldorf et al. | 528/346 |
| 4,731,421 | 3/1988 | Hoppe et al. | 528/310 |
| 4,794,158 | 12/1988 | Hasuo et al. | 528/346 |
| 4,954,612 | 9/1990 | Nomura et al. | 528/353 |
| 4,958,001 | 9/1990 | Kikuchi et al. | 528/346 |
| 5,300,620 | 4/1994 | Okikawa et al. | 528/353 |
| 5,300,627 | 4/1994 | Kunimune et al. | 528/353 |
| 5,714,572 | 2/1998 | Kato | 528/353 |

FOREIGN PATENT DOCUMENTS

A-61-118424  6/1986  Japan .
A-1-121325  5/1989  Japan .

*Primary Examiner*—P. Hampton-Hightower
*Attorney, Agent, or Firm*—Barnes & Thornburg

[57] ABSTRACT

A solvent-soluble siloxane polyimide comprising a copolymer obtained by reaction of a diamine compound mixture comprising a diaminopolysiloxane and an alicyclic diamine with an aromatic tetracarboxylic acid anhydride, followed by polyimidization reaction of the resulting polyamic acid forms a heat-resistant adhesive by adding an epoxy resin, a diamine-based curing agent and an organic solvent thereto, The formed adhesives show a distinguished heat-resistant adhesiveness when the resulting siloxane polyimide soluble in ordinary organic solvents is used as a main component of the adhesive for bonding between a base material and a copper foil of a flexible printed substrate. By further addition of a fluorinated resin to the heat-resistant adhesive, the adhesiveness can be more improved.

11 Claims, No Drawings

SILOXANE POLYIMIDE AND HEAT-RESISTANT ADHESIVE CONTAINING THE SAME

BACKGROUND OF THE INVENTION

1. Field of the Invention

The present invention relates to a siloxane polyimide and a heat-resistant adhesive containing the same, and more particularly to a solvent-soluble siloxane polyimide and a heat-resistant adhesive containing the same.

2. Description of Related Art

Heat-resistant adhesives containing an aromatic polyimide, etc. as a main component have been so far used in bonding between a base material and a copper foil of a flexible printed substrate. However, the aromatic polyimide is generally insoluble in ordinary organic solvents, and thus is used in the form of a solution of an aromatic polyamic acid as its precursor, which specifically requires an additional polyimidization reaction step with heating at a high temperature for a long time successively after application and drying of the solution. The polyimidization reaction step has such problems as occurrence of void phenomena and thermal deterioration of electronic parts per se.

JP-A-61-118424, JP-A-1-121325, etc. on the other hand, disclose solvent-soluble siloxane polyimides, but have such problems as low heat resistance, insufficient solubility in a variety of organic solvents, considerable curling of substrates when drying solution-applied flexible printed substrates, etc.

SUMMARY OF THE INVENTION

An object of the present invention is to provide a siloxane polyimide soluble in ordinary organic solvents, which has a distinguished heat-resistant adhesiveness when used as a main component of an adhesive for bonding between a base material and a copper foil of a flexible printed substrate.

A solvent-soluble siloxane polyimide according to the present invention comprises a copolymer of diamine compound mixture comprising a diaminopolysiloxane and an alicyclic diamine with an aromatic tetracarboxylic acid dianhydride.

DETAILED DESCRIPTION OF THE INVENTION

For a diaminopolysiloxane, which is one component of the diamine compound mixture reactive with an aromatic tetracarboxylic acid dianhydride, a compound represented by the following general formula can be used:

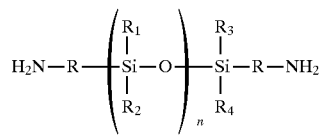

where R respresents a divalent hydrocarbon group having 2 to 6 carbon atoms, preferably 3 to 5 carbon atoms; $R_1$ to $R_4$ each independently represent a lower alkyl group having 1 to 5 carbon atoms and a phenyl group; and n represents an integer of 0 to 30, preferably 4 to 12.

The compound includes, for example, compounds having R and $R_1$ to $R_4$ in the following combinations:

| R | $R_1$ | $R_2$ | $R_3$ | $R_4$ |
|---|---|---|---|---|
| $(CH_2)_3$ | $CH_3$ | $CH_3$ | $CH_3$ | $CH_3$ |
| $(CH_2)_4$ | $CH_3$ | $CH_3$ | $CH_3$ | $CH_3$ |
| $(CH_2)_3$ | $CH_3$ | $C_6H_5$ | $CH_3$ | $C_6H_5$ |
| $p\text{-}C_6H_4$ | $CH_3$ | $CH_3$ | $CH_3$ | $CH_3$ |

In practice, such commercially available products as TSL9386, TSL9346 and TSL9306 (products available from Toshiba Silicone K. K., Japan), BY16-853U (product available from Toray-Dow Corning K. K., Japan), X-22-161AS (product available from Shinetsu Kagaku Kogyo K. K., Japan), F2-053-01 (product available from Nihon Unicar K. K., Japan), etc. can be used.

For an alicyclic diamine, which is another component of the diamine compound mixture, diamines having at least one cyclohexane ring, for example, 1,3-bis(aminomethyl)cyclohexane, 1,4-bis(aminomethyl)cyclohexane, 1,3-diaminocyclohexane, etc. can be used alone or in mixture.

The diaminopolysiloxane and the alicyclic diamine are used in a ratio of the former to the latter of about 95 to about 5%: about 5 to about 95% by mole, preferably about 80 to about 40%: about 20 to about 60% by mole. When the latter is in a ratio of less than about 5% by mole, the heat-resistant adhesiveness as desired in the present invention cannot be obtained, whereas when the latter is in a ratio of more than about 95% by mole the adhesive composition will lack in the softness.

For an aromatic tetracarboxylic acid dianhydride reactive with the diamine compound mixture, 3,3',4,4'-benzophenone-tetracarboxylic acid dianhydride, 3,3',4,4'-diphenyl-sulfonetetracarboxylic acid dianhydride, 4,4'-oxydiphthalic acid dianhydride, 4,4'-biphthalic acid dianhydride, 2,2'-diphthalic acid dianhydride propane, diphthalic acid dianhydride methane, pyromellitic acid dianhydride, 2,2'-(hexafluoroisopropylidene) diphthalic acid dianhydride, etc. can be used in an equimolar amount to the diamine compound mixture.

Reaction of the diamine compound mixture with the aromatic tetracarboxylic acid dianhydride is carried out preferably in an aprotic polar solvent such as dimethylformamide, dimethyl-acetamide, N-methylpyrrolidone, etc., or also in a polar solvent such as cresol, pyridine, etc. In practice, the reaction is carried out by dropwise addition of the diamine compound mixture to a polar solvent solution of the aromatic tetracarboxylic acid dianhydride at a temperature of about 0° to 10° C.

The reaction product is a polyamic acid as a polyimide precursor, and thus is to be subjected to dehydration reaction for polyimidizing the polyamic acid. Dehydration reaction is carried out at a temperature of about 100° to about 200° C., preferably using a dehydrating agent such as acetic anhydride, etc.

Siloxane polyimide as a polyimidization reaction product seems to be a block copolymer having repeating units (a) and (b) represented by the following general formulae and having a weight average molecular weight Mw of about 10,000 to about 100,000, preferably about 25,000 to about 75,000 (as determined by GPC and in terms of polystyrene):

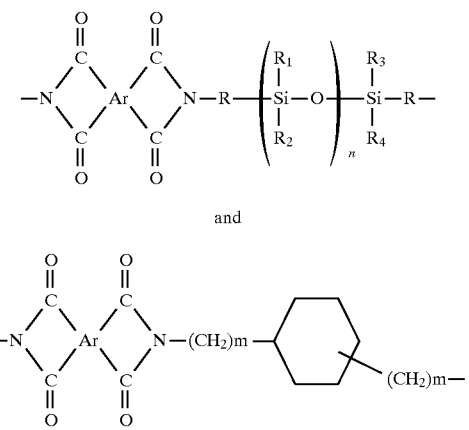

where Ar represents an aromatic tetracarboxylic acid residue; R represents a divalent hydrocarbon group having 2 to 6 carbon atoms, preferably 3 to 5 carbon atoms; $R_1$ to $R_4$ each independently represents a lower alkyl group having 1 to 5 carbon atoms and a phenyl group, n represents an integer of 0 to 30, preferably 4 to 12; and m represents 0 or 1.

The resulting siloxane polyimide can be formed into a heat-resistant adhesive by adding an epoxy resin, a diamine-based curing agent and an organic solvent thereto.

For an epoxy resin, any of bisphenol A type, biphenyl type, glycidylamine type, novolak type, etc. can be used. In practice, commercially available epoxy resins, such as Epikote 154, 604, 871, 828, etc. (products available from Yuka-Shell K. K., Japan) can be used. About 0.1 to about 30 parts by weight, preferably about 0.1 to about 10 parts by weight, of the epoxy resin is used on the basis of 100 parts by weight of the siloxane polyimide. When the epoxy resin is used in an amount of less than about 0.1 parts by weight, the adhesiveness will be lowered, whereas when it is used in an amount of more than about 30 parts by weight the heat resistance will be lowered.

The diamine-based curing agent is used to cure the epoxy resin, and about 0.1 to about 30 parts by weight, preferably about 0.1 to about 10 parts by weight of the diamine-based curing agent such as 4,4'-diaminodiphenylsulfone, 4,4'-diamino-diphenylmethane, m-phenylenediamine, m-xylylenediamine, isophoronediamine, diethylenetriamine, triethylenetetramine, etc. can be used on the basis of 100 parts by weight of the siloxane polyimide.

The foregoing epoxy resin and diamine-based curing agent are dissolved in an ordinary, low boiling point organic solvent such as methylethylketone, chloroform, tetrahydrofuran, toluene, etc. at a solid concentration of about 10 to about 50% by weight, preferably about 20 to about 40% by weight to make a solution of adhesive composition.

By adding a fluorinated resin to an adhesive composition comprising such components, the adhesiveness can be more improved. The fluorinated resin for use in such addition includes, for example, polytetrafluoroethylene, tetrafluoroethylene-perfluoro(alkyl vinyl ether) copolymer, tetrafluoroethylene-hexafluoropropene copolymer, tetrafluoroethylene-ethylene copolymer, polychlorotrifluoroethylene, chloro-trifluoroethylene-ethylene copolymer, poly(vinylidene fluoride), poly(vinyl fluoride), etc. Preferably, polytetrafluoroethylene can be used. In practice, about 0.1 to about 15 parts by weight, preferably about 3 to about 10 parts by weight, of a commercially available fluorinated resin such as Rubron-L5, Rubron-L2, etc. (products available from Daikin Kogyo K. K., Japan) is used per 100 parts by weight of siloxane polyimide.

The solution of adhesive composition so prepared can be effectively used for bonding between a base material and a copper foil of a flexible printed substrate. In practice, the solution is applied to a flexible base material such as a polyimide film, etc. and a copper foil as a constituent member of a printed wiring is then laid thereon, followed by pressing at about 185° C. for about 100 seconds, whereby effective bonding can be obtained.

An adhesive containing a novel siloxane polyimide according to the present invention as an effective adhesive component is soluble even in an ordinary low boiling point organic solvent such as an aprotic polar solvent in which an aromatic polyimide is insoluble, and thus can make application condition for bonding milder, thereby unnecessitating press bonding at a high temperature for a long time in contrast to the conventional aromatic polyimide-based adhesives. That is, in the present invention, bonding can be carried out at a lower temperature for a shorter time with a distinguished heat-resistant adhesiveness. Furthermore, there are no curling phenomena at all of the flexible printed substrates subjected to bonding between the base material and the copper foil with the heat-resistant adhesive according to the present invention.

PREFERRED EMBODIMENTS OF THE INVENTION

The present invention will be described in detail below, referring to Examples and Comparative Example.

EXAMPLES 1 TO 4

1.61 g (5 m moles) of 3,3',4,4'-benzophenonetetracarboxylic acid dianhydride and 15 ml of N-methylpyrrolidone were charged into a separable flask having a capacity of 100 ml under a nitrogen atmosphere and the resulting solution was ice-cooled. Then, diaminopolysiloxane [TSL9386, a product available from Toshiba Silicone K. K., Japan: R is a ($CH_2$) group and $R_1$ to $R_4$ each are a $CH_3$ group] and 1,3-bis(aminomethyl)cyclohexane were added thereto in amounts given in the Table, respectively, while keeping the temperature at about 0° to 10° C. and then the mixture was stirred at room temperature for 30 minutes to obtain a solution. Then, the solution was heated to 50° C., stirred for 3 hours, then heated to 200° C. and stirred for 3 hours to conduct dehydration reaction. After the reaction, the reaction product was reprecipitated in water to obtain siloxane polyimide.

One part by weight of an epoxy resin (Epikote 604) and one part by weight of 4,4'-diaminodiphenylsulfone were added to 100 parts by weight of the siloxane polyimide so obtained to prepare a methylethylketone solution at a solid concentration of 40% by weight. The resulting solution was applied to a polyimide film, dried at 140° C. for 5 minutes, and then preheated at 185° C. and 37 kg/cm² gage for 30 seconds. A copper foil was laid thereon by pressing for 70 seconds, followed by curing at 180° C. for 12 hours. A 90° peel strengths at room temperature and 150° C. were measured.

EXAMPLES 5 TO 8

In Example 1, diaminopolysiloxane was changed to BY16-853U (a product available from Toray-Dow Corning K. K., Japan).

EXAMPLES 9 TO 12

In Example 1, diaminopolysiloxane was changed to X-22-161AS (a product available from Shinetsu Kagaku K. K., Japan).

EXAMPLES 13 TO 16

In Example 1, 5 parts by weight of Epikote 154 was used as an epoxy resin, and the amount of 4,4'-diaminodiphenylsulfone was changed to 5 parts by weight.

EXAMPLES 17 TO 20

In Examples 5 to 8, 5 parts by weight of Epikote 154 was used as an epoxy resin, and the amount of 4,4'-diaminodiphenyl-sulfone was changed to 5 parts by weight.

EXAMPLES 21 TO 24

In Examples 9 to 12, 5 parts by weight of Epikote 154 was used as an epoxy resin and the amount of 4,4'-diaminodiphenyl-sulfone was changed to 5 parts by weight.

COMPARATIVE EXAMPLE

In the production of siloxane polyimide of Example 1, the same amount of 1,3-bis (4-aminophenoxy)benzene was used in place of 1,3-bis(aminomethyl)cyclohexane. The resulting siloxane polyimide was found insoluble in ordinary low boiling point solvents such as methylethylketone, etc.

Results of measurement of 90° peel strengths at room temperature and 150° C. are shown in the following Table 1 together with amounts of diaminopolysiloxane and 1,3-bis (aminomethyl)-cyclohexane [BAMC] used and weight average molecular weights Mw of the resulting siloxane polyimides. In all the Examples, no curling phenomena were observed at all.

TABLE 1

| Ex. No. | Diaminopoly-siloxane (g) | BAMC (g) | Weight average molecular weight Mw | 90° Peel strength at room temp. (kg/cm) | 90° Peel strength at 150° C. (kg/cm) |
|---|---|---|---|---|---|
| 1 | 0.802 | 0.568 | 44000 | 0.83 | 0.64 |
| 2 | 1.203 | 0.497 | 69000 | 0.95 | 0.55 |
| 3 | 1.604 | 0.426 | 60000 | 1.08 | 0.61 |
| 4 | 2.005 | 0.355 | 31000 | 1.05 | 0.83 |
| 5 | 0.88 | 0.568 | 29000 | 1.03 | 0.53 |
| 6 | 1.32 | 0.497 | 25000 | 0.91 | 0.74 |
| 7 | 1.76 | 0.426 | 29000 | 1.00 | 0.93 |
| 8 | 2.20 | 0.355 | 21000 | 1.16 | 1.16 |
| 9 | 0.90 | 0.568 | 41000 | 1.16 | 0.55 |
| 10 | 1.35 | 0.497 | 50000 | 1.00 | 0.59 |
| 11 | 1.80 | 0.426 | 36000 | 1.04 | 0.71 |
| 12 | 2.25 | 0.355 | 29000 | 1.19 | 0.85 |
| 13 | 0.802 | 0.568 | 44000 | 0.94 | 0.63 |
| 14 | 1.203 | 0.497 | 69000 | 1.03 | 0.63 |
| 15 | 1.604 | 0.426 | 60000 | 1.19 | 0.66 |
| 16 | 2.005 | 0.355 | 31000 | 1.18 | 0.75 |
| 17 | 0.88 | 0.568 | 29000 | 1.03 | 0.66 |
| 18 | 1.32 | 0.497 | 25000 | 0.91 | 0.71 |
| 19 | 1.76 | 0.426 | 29000 | 0.99 | 0.66 |
| 20 | 2.20 | 0.355 | 21000 | 1.23 | 0.70 |
| 21 | 0.90 | 0.568 | 41000 | 1.13 | 0.51 |
| 22 | 1.35 | 0.497 | 50000 | 1.03 | 0.58 |
| 23 | 1.80 | 0.426 | 36000 | 1.03 | 0.75 |
| 24 | 2.25 | 0.355 | 29000 | 1.25 | 0.80 |

Siloxane polyimido obtained in Comparative Example was dissolved in dimethylformamide and the resulting solution was applied to a polyimide film with the same mixing composition under the same conditions as in Example 1. 90° peel strengths at room temperature and 150° C. were found to be as low as 0.2 kg/cm, respectively.

EXAMPLES 25 TO 27

One part by weight (Example 25), 5 parts by weight (Example 26) or 10 parts by weight (Example 27) of fluorinated resin (Rubron-L5) was added to the adhesive of Example 1.

EXAMPLES 28 TO 30

In Examples 25 to 27, 5 parts by weight of Epikote 154 was as the epoxy resin and the amount of 4,4'-diaminodiphenyl sulfone was changed to 5 parts by weight.

90° Peel strength at room temperature of the adhesive films obtained in the foregoing Examples 25 to 30 is shown in the following Table 2. Figures in paretheses show the cases without any addition of fluorinated resin.

TABLE 2

| Ex. No. | 90° Peel strength at room temp. (Kg/cm) |
|---|---|
| 25 | 1.98 (0.81) |
| 26 | 2.05 (0.81) |
| 27 | 1.80 (0.81) |
| 28 | 1.18 (0.95) |
| 29 | 1.60 (0.95) |
| 30 | 1.73 (0.95) |

What is claimed is:

1. A process for producing a solvent-soluble siloxane polyimide, which comprises reacting a diamine compound mixture comprising a diaminopolysiloxane represented by the following general formula:

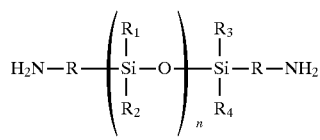

wherein R represents a divalent hydrocarbon group having 2 to 6 carbon atoms; $R_1$ to $R_4$ each independently represent a lower alkyl group having 1 to 5 carbon atoms and a phenyl group; and n is an integer of 0 to 30, and an alicyclic diamine having at least one cyclohexane ring with an aromatic tetracarboxylic acid dianhydride in an equimolar amount and polyimidizing the resulting polyamic acid.

2. A heat-resistant adhesive, which comprises a siloxane polyimide comprising a block copolymer having repeating units (a) and (b) represented by the following general formulae:

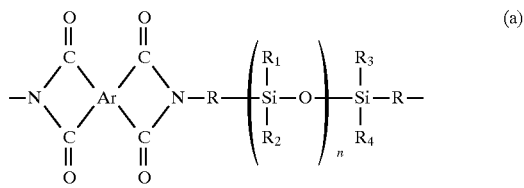

and

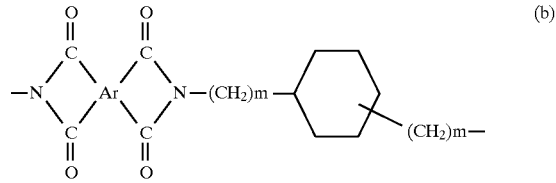

where Ar represents an aromatic tetracarboxylic acid residue; R represents a divalent hydrocarbon group having 2 to 6 carbon atoms; $R_1$ to $R_4$ each independently represent a lower alkyl group having 1 to 5 carbon atoms and a phenyl group; and m represents 0 or 1, an epoxy resin, a diamine-based curing agent and an organic solvent.

3. A solvent-soluble siloxane polyimide, which comprises a block copolymer having repeating units (a) and (b) represented by the following general formulae:

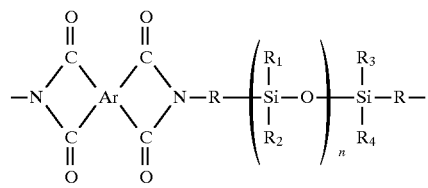

and

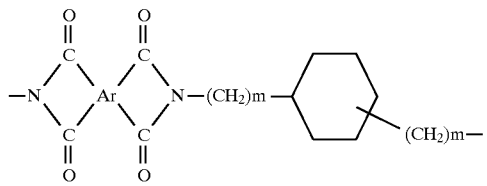

where Ar represents an aromatic tetracarboxylic acid residue; R represents a divalent hydrocarbon group having 2 to 6 carbon atoms; $R_1$ to $R_4$ each independently represent a lower alkyl group having 1 to 5 carbon atoms and a phenyl group; n is an integer of 0 to 30; and m represents 0 or 1.

4. A process according to claim 1, wherein the diamine containing at least one cyclohexane ring is 1,3-bis(aminomethyl)cyclohexane, 1,4-bis(aminomethyl)cyclohexane or 1,3-diaminocyclohexane.

5. A process according to claim 1, wherein the diaminopolysiloxane and the alicyclic diamine are used in a ratio of the former to the latter of about 95 to about 5%: about 5 to about 95% by mole.

6. A process according to claim 1, wherein the diaminopolysiloxane and the alicyclic diamine are used in a ratio of the former to the latter of about 80 to about 40: about 20 to about 60% by mole.

7. A heat-resistant adhesive according to claim 2, wherein about 0.1 to about 30% by weight of the epoxy resin is used on the basis of the siloxane polyimide.

8. A heat-resistant adhesive according to claim 2, wherein about 0.1 to about 30% by weight of the diamine-based curing agent is used on the basis of the siloxane polyimide.

9. A heat-resistant adhesive according to claim 2, wherein a fluorinated resin is further contained.

10. A heat-resistant adhesive according to claim 2, wherein the adhesive is used for bonding between a base material and a copper foil of a flexible printed substrate.

11. A heat-resistant adhesive according to claim 9, wherein the adhesive is used for bonding between a base material and a copper foil of a flexible printed substrate.

* * * * *